United States Patent
Peterson (10) Patent No.: US 7,429,882 B2
(45) Date of Patent: Sep. 30, 2008

(54) AC-DC INPUT BUFFER

(75) Inventor: Luverne R. Peterson, San Diego, CA (US)

(73) Assignee: Toshiba America Electronic Components, Inc. (JP)

( * ) Notice: Subject to any disclaimer, the term of this patent is extended or adjusted under 35 U.S.C. 154(b) by 0 days.

(21) Appl. No.: 11/449,325

(22) Filed: Jun. 8, 2006

(65) Prior Publication Data

US 2007/0285134 A1    Dec. 13, 2007

(51) Int. Cl.
    *H03K 3/00*    (2006.01)
(52) U.S. Cl. .................... 327/108; 330/260
(58) Field of Classification Search ............. 327/108; 330/260
    See application file for complete search history.

(56) References Cited

U.S. PATENT DOCUMENTS

| | | | | |
|---|---|---|---|---|
| 4,293,208 A * | 10/1981 | Bagdis | ............ | 396/169 |
| 5,128,560 A * | 7/1992 | Chern et al. | ............ | 326/81 |
| 5,532,621 A * | 7/1996 | Kobayashi et al. | ............ | 326/86 |
| 5,635,880 A * | 6/1997 | Brown | ............ | 331/108 B |
| 5,994,939 A * | 11/1999 | Johnson et al. | ............ | 327/280 |
| 6,304,149 B1 * | 10/2001 | Kim | ............ | 331/57 |
| 6,369,631 B1 * | 4/2002 | Sachdev et al. | ............ | 327/211 |
| 6,853,233 B1 * | 2/2005 | Terletzki et al. | ............ | 327/333 |
| 7,123,080 B2 * | 10/2006 | Furukawa et al. | ............ | 327/536 |

* cited by examiner

*Primary Examiner*—Kenneth B. Wells
(74) *Attorney, Agent, or Firm*—Tucker Ellis & West LLP (57) ABSTRACT

An inverting input buffer that uses the best features of an AC input buffer (low delay, high speed, high input voltage swing range) and a DC input buffer (stability, reliability, 'automatic' high and low data setup, input VIL and VIH "Voltage Input Low" and "Voltage Input High" margins). The delay though the buffer with a nominal load is very small. Optionally, a voltage tolerant input circuit is coupled to the DC input, which enables the DC input buffer to tolerate higher voltage swings, thus allowing a single buffer to switch both high (e.g. 2.5 volts-5 volts in a 1.2 volt system) and low input voltages (e.g. below 2.5 volts in a 1.2 volt system).

17 Claims, 7 Drawing Sheets

AC-DC INPUT BUFFER

BACKGROUND OF THE INVENTION

The present invention relates to a general purpose, multi signal voltage level buffer.

There are several well known problems associated with the typical input buffer. One problem is the delay through the inverting input buffer. Alternating Current (AC) buffers are faster than Direct Current (DC) buffers, but have problems with stability. DC buffers are more stable than AC buffers, but their switching speed can be too slow. Another problem with input buffers is the switching voltage level is typically off center. Still another problem with input buffers is their noise immunity with respect to ground can be unacceptable. Furthermore, a number of layouts of input buffers are often needed to switch different input voltages (e.g. 2.5v, 3.3v and 5v). These and other problems associated with present day input buffers are addressed by the present invention which will now be described herein.

BRIEF SUMMARY OF THE INVENTION

In accordance with an aspect of the present invention, there is described herein an inverting input buffer that uses the best features of an AC input buffer (low delay, high speed, high input voltage swing range) and a DC input buffer ('automatic' high and low data setup, good input VIL and VIH (Voltage Input Low and Voltage Input High) margins. The delay though the buffer with a nominal output load is very small. Optionally, a voltage tolerant input circuit is coupled to the DC input buffer, which enables the DC input to tolerate voltage swings higher than the IO Buffer supply (Vdd) voltage, thus allowing a single buffer to switch both high (e.g. 2.5 volts-5 volts in a 1.2 volt system).and low input voltages (e.g. below 2.5 volts in a 1.2 volt system).

Aspects of the present invention include low delay through the inverting buffer, noise immunity with respect to ground and the input switch level is half the switch voltage input (VIN/2). Additionally, employing the voltage tolerant input circuit enhances versatility as one buffer can be used for a wide range of input signal levels (e.g. 2.5v, 3.3v and 5v).

Still other objects of the present invention will become readily apparent to those skilled in this art from the following description wherein there is shown and described a preferred embodiment of this invention, simply by way of illustration of at least one of the best modes best suited to carry out the invention. As it will be realized, the invention is capable of other different embodiments and its several details are capable of modifications in various obvious aspects all without departing from the invention. Accordingly, the drawing and descriptions will be regarded as illustrative in nature and not as restrictive.

BRIEF DESCRIPTION OF THE SEVERAL VIEWS OF THE DRAWING

The accompanying drawings incorporated in and forming a part of the specification, illustrates several aspects of the present invention, and together with the description serve to explain the principles of the invention.

DETAILED DESCRIPTION OF INVENTION

Throughout this description, the preferred embodiment and examples shown should be considered as exemplars, rather than limitations, of the present invention. The present invention is directed to an inverting input buffer that uses the best features of an AC input buffer (low delay, high speed, high input voltage swing range) and the best features of a DC input buffer (stability and reliability).

Figure 1:
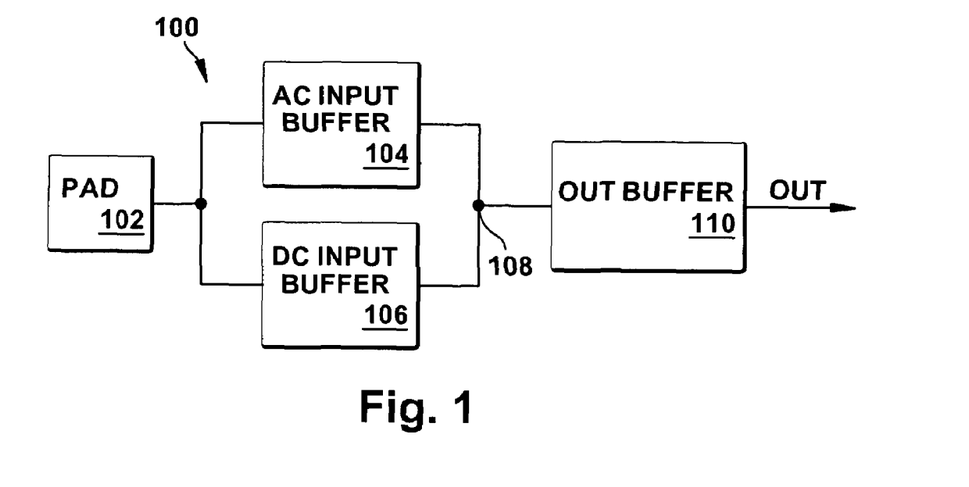
FIG. 1 is a schematic diagram of an AC-DC input buffer in accordance with an aspect of the present invention.

Referring to FIG. 1, there is illustrated an AC-DC Input Buffer circuit 100 in accordance with an aspect of the present invention. PAD 102 is coupled to an AC Input Buffer 104 and a DC Input Buffer 106. The outputs of AC Input Buffer 104 and DC Input Buffer are coupled together at node (also referred to herein as Intermediate Node or "IN") 108, which is coupled to an input of output (Out) buffer 110.

In operation, AC input buffer quickly passes changes at PAD 102 to Intermediate Node 108. DC input buffer 106 then functions to add stability to circuit 100 by holding the voltage at Intermediate Node 108 as it reacts to the change at PAD 102. Out buffer 110 then reacts to the change at the intermediate node 108 accordingly. In a preferred embodiment, out buffer 110 is an inverter, thus the output of out buffer 110 is the input at PAD 102 inverted.

As will be described herein, additional components can be added to circuit 100 to aid stability and/or to protect circuit 100. For example, a voltage tolerant input circuit can be coupled in series with the direct current input buffer. The voltage tolerant input circuit protects the input transistors of DC Input Buffer 106 from 5 Volt input stress at the DC input port. The voltage output from the voltage tolerant input circuit for a 0 to 5 Volt input signal will be from 0 to about 2.6 volts (if the voltage tolerant input circuit uses a 3.3 Volt Power Supply), or 0 to 1.9 volts (if the voltage tolerant input circuit uses a 2.5 Volt Power Supply). If the input pad voltage swing is lower, e.g. 3.3 Volts or 2.5 Volts, then the voltage tolerant input circuit is not needed, but to keep the number of different input buffer layouts to a minimum it can be left in.

In a preferred embodiment, AC Input Buffer 104 comprises a metal capacitor used for AC coupling of the input signal to IN node 108. A capacitor made of interdigitated metal 2 lines is suitable for this application. The capacitance of the capacitor can be adjusted by connecting fewer or more metal 2 lines to IN node 108.

DC input buffer 106 performs several functions in addition to transmitting a high or low voltage to IN node 108. The buffer translates voltages from 1.9 Volts to 2.6 Volts at the input to 1.2 Volts. In a preferred embodiment, DC input buffer 106 comprises a hold circuit to keep the input from switching due to input signal oscillation (overshoot and undershoot) within a predetermined time of a transition (e.g. 2 nsec). The DC input buffer 106 (because it does have a DC input) will 'preset the signal level at IN node 108 to match the signal level on the Pad 102. Since the DC input is slower than the AC input, the DC input is more of a backup circuit.

Circuit 100 may further comprise an inverter and a delay buffer coupled to node 108 and to the hold circuit of DC input buffer 106. The inverter and delay buffer are used to control the timing of the hold circuit in DC input buffer 106. When IN node 108 first changes state, the inverter activates the hold circuit until the delay buffer (which responds to the change of state slower than the inverter) deactivates the hold circuit.

Circuit 100 may further comprise a latch circuit coupled to IN 108. A latch helps hold the high or low state on IN node 108. It also adds some hysteresis and resists false AC data changes due to input voltage noise.

Circuit 100 may further comprise a voltage overprotect (OVRPROT) circuit that keeps the voltage at IN node 108 from excessively exceeding VDDC voltage (e.g. 1.2 Volts) and from going below ground far enough to reverse bias the drain diodes of the latch transistors.

Figure 2:
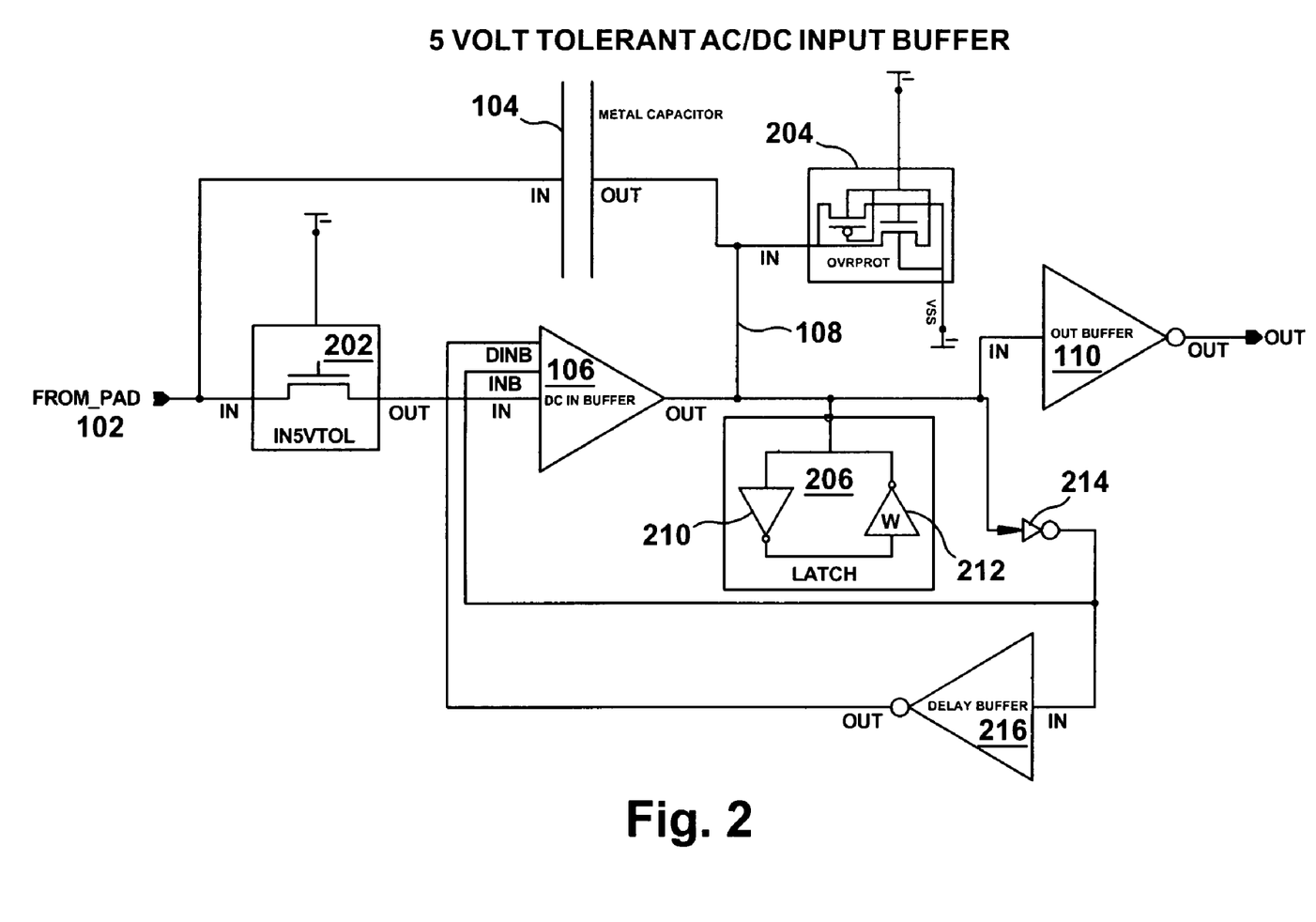
FIG. 2 is a schematic diagram of an AC-DC input buffer as described in FIG. 1 with additional features for enhanced stability.

FIG. 2 is a schematic diagram of an AC-DC input buffer 200 as described in FIG. 1 with additional features for enhanced stability. As illustrated, and as will be described in more detail in FIG. 3, buffer 200 is a 5 volt tolerant buffer, capable of responding to voltage swings of 5 volts, even though the DC input buffer (DC in buffer) 106, voltage overprotect (OVRPROT) 204, Latch 206, Inverter 214, Delay Buffer 216 and out buffer 110 are supplied by a 1.2 volt supply. Voltage tolerant input circuit (IN5VTOL) 202, as illustrated, is supplied by a 3.3 volt supply.

The signal from PAD 102 (FIG. 1) is received by AC input buffer 104 and a voltage tolerant input circuit (IN5VTOL) 202 coupled in series with DC input buffer 106. Voltage tolerant input circuit 202 is used to protect the input transistors of DC input buffers 202 from 5 Volt input stress. The voltage range for a 0 to 5 Volt input signal from PAD 102 will be reduced to a range of 0 to about 2.6 volts (with VDD3P3 at 3.3 Volts, if VDD3P3 is at 2.5 Volts the output "OUT" from voltage tolerant input circuit 202 ranges from 0 to 1.9 Volts) at the output of voltage tolerant input circuit 202. If the input pad voltage swing is 3.3 Volts or 2.5 Volts then the voltage tolerant input circuit is not needed, but it can remain in circuit 200 to keep the number of different input buffer layouts to a minimum. Voltage tolerant input circuit 202 Is improves the versatility of circuit 200 as it enables a single buffer to be used for multiple input signal levels, such as 2.5v, 3.3v and 5v.

AC input buffer 104 comprises a metal capacitor. The metal capacitor is used for AC coupling of the input signal to IN node 108. In a preferred embodiment, the capacitor is comprised of interdigitated metal 2 lines. The capacitance of the capacitor can be adjusted by connecting fewer or more metal 2 lines. The capacitance of AC input buffer 104 can be selected to control the voltage swing at IN node 108. The capacitor enables changes in input signal to be quickly provided to IN node 108, which is the input of out buffer 110.

DC input buffer 106, as was described hereinabove, performs several functions in addition to transmitting a high or low voltage to IN node 108. DC input buffer 106 translates the voltage from its input ranging from 1.9 Volts to 2.6 Volts to 1.2 Volts. A hold circuit, which will be described in more detail in FIG. 3, can be employed to keep the input from switching due to input signal oscillation (overshoot and undershoot) within a transition period (e.g. 2 nsec). DC input buffer 106 (because it does have a DC input) will 'preset the signal level on the IN node 108 to match the signal level on the Pad 102 (high or low). Since the DC input buffer 106 is slower than the AC input buffer 104, the DC input is more of a backup circuit.

The voltage overprotect circuit (OVRPROT) 204 keeps the voltage on IN node 108 from exceeding the VDDC voltage 1.2 Volts by more than a desired amount and from going below ground far enough to reverse bias the drain diodes of the transistors in Latch 206.

Latch 206 comprises two inverters 210, 212 coupled together in a complementary manner, i.e. the input of inverter 210 is coupled to the output of inverter 212, and the output of inverter 210 is coupled to the input of inverter 212. Latch 206 helps hold the high or low state on IN node 108. It also adds some hysteresis to circuit 200 and resists false AC data changes due to input voltage noise (Latch 206 can protect against input noise of approximately 1-1.25 volts).

INB inverter 214 and delay buffer 216 are used to control the timing of a hold circuit in the DC input buffer 106. INB inverter 214 turns on the hold circuit until delay buffer 216 turns the hold circuit off. Delay buffer 216 may suitably comprise a plurality of delay buffers, the number of delay buffers determining the amount of time that elapses from when INB inverter 214 turns on the hold circuit and delay buffer 216 turns off the hold circuit.

Figure 3:
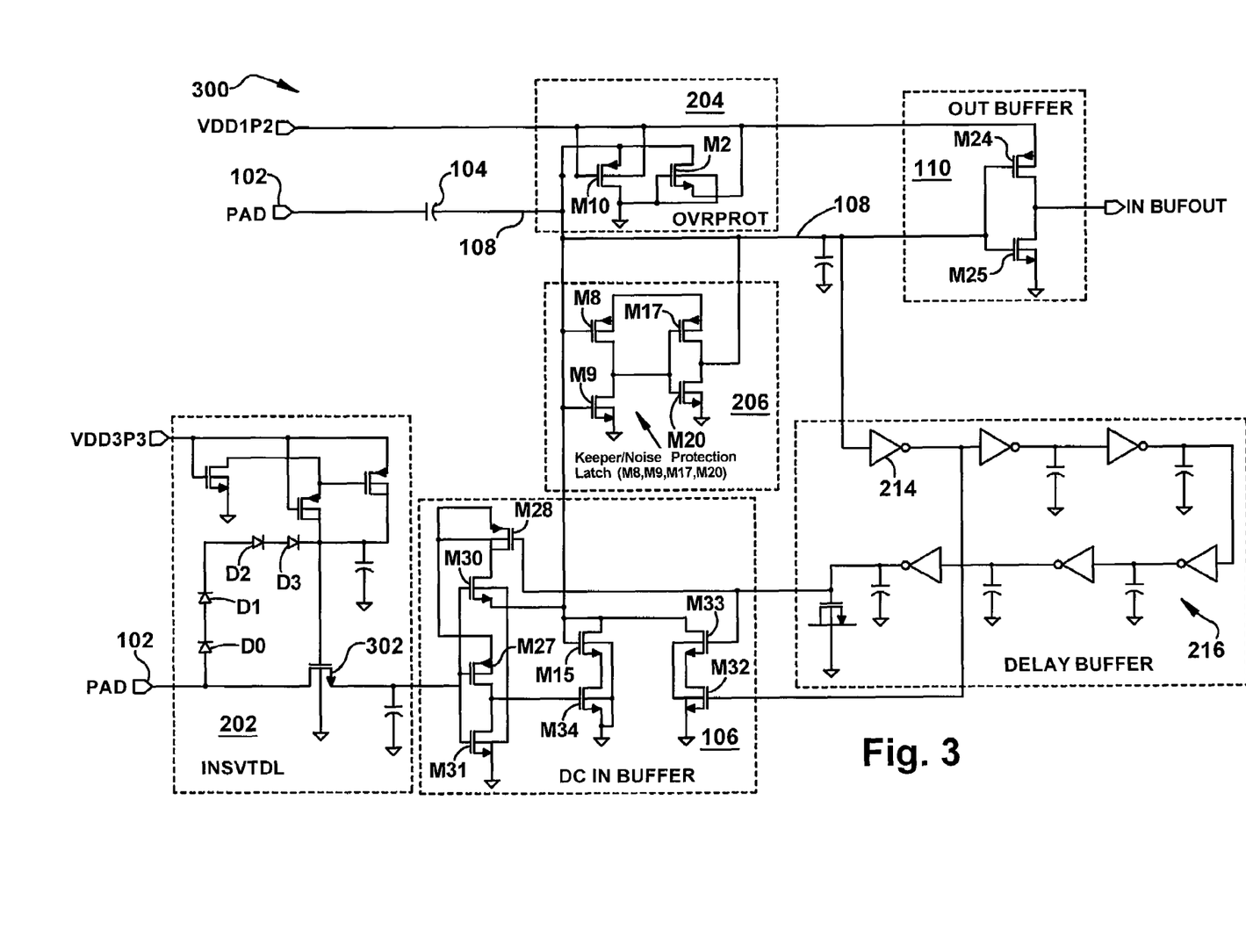
FIG. 3 is a detailed schematic diagram of the AC-DC input buffer described in FIG. 2.

FIG. 3 is a detailed schematic diagram of the AC-DC input buffer 300 described in FIG. 2. Although as illustrated there is a separate PAD 102 input to voltage tolerant input circuit 202 and to AC input buffer 104, those skilled in the art should readily appreciate that this is merely for ease of illustration as PAD input 102 is ordinarily a single input. In the embodiment illustrated in FIG. 3, the highest chip voltage is 3.3 volts (the input on PAD 102 may be from a source external to the chip and therefore can be higher than 3.3 volts), and DC input buffer 106 is supplied 1.2 volts.

Input voltage tolerance circuit 202, comprises diodes D0, D1, D2, D3. Diodes D0, D1, D2, D3 protect the gates of transistors M27, M30 and M31 of input buffer 106 from over voltage. If a high voltage (e.g. 5V) is applied on PAD, diodes D0, D1, D2, D3 turn on and lower the voltage that is applied to the gates of transistors M27, M30 and M31. Another aspect of diodes D0, D1, D2, D3 in Input Voltage Tolerance circuit 202 is that diodes D0, D1, D2 and D3 will turn on and conduct if a high voltage (e.g. 5V) is applied to PAD 102 before the 3.3 voltage (VDD3P3) is applied, thus providing protection while system 300 is powering on. In this scenario, input pass transistor 302 also protects the inputs of DC input buffer 106.

In a preferred embodiment, AC input buffer 104 comprises a capacitor. The value of the capacitance 104 can be selected to match the parasitic capacitance of the components (e.g. voltage overprotection circuit 204, output of DC buffer 106, Latch 206, input of inverter 214 and input of Out Buffer 110) coupled to intermediate node 108. In the exemplary embodiment illustrated in FIG. 3, 104 is a 60 femto farad (ff) capacitor.

The value of 104 can be varied to control the voltage swing at Intermediate Node 108. Changing the ratio of 104 to the parasitic capacitance changes the voltage swing at Intermediate Node 108. For example, in the illustrated embodiment the voltage at Intermediate Node 108 changes by 1 volt for every 2 volt change at PAD 102. By reducing 104 to 50 ff will reduce the voltage swing observed at Intermediate Node 108 (e.g. the voltage swing at IN 108 will be less than 1 volt for every 2 volt change at PAD 102), while increasing 104 to 80 ff will increase the amount of voltage swing observed at Intermediate Node 108 (e.g. the voltage swing at IN 108 will be greater than 1 volt for every 2 volt change at PAD 102). If 104 is a interdigitated finger capacitor, the capacitance can be changed by either adding additional fingers to increase the capacitance or shorting out fingers to decrease the capacitance.

An aspect of utilizing capacitor 104 is that it enables circuit 300 to handle an input voltage swing (e.g. 5 volts) that is larger than the core internal voltage (e.g. 1.2 volts). As noted hereinabove, by setting the capacitance of 104 equal to the parasitic capacitance of IN node 108, the voltage swing at IN node 108 will be one-half the voltage swing at pad 102. Out buffer 110, comprising transistors M24 and M25, is responsive to signals at IN node 108, and switches accordingly.

Because the voltage swing at IN node 108 can be greater than the internal core voltage (e.g. for a 5 volt pad input voltage swing, the voltage swing at IN 108 can be 2.5 volts, which would exceed the 1.2 volt internal core voltage of the chip), voltage overprotect circuit (OVRPROT) 204 keeps the voltage on IN node 108 from exceeding the VDDC voltage (e.g. 1.2 Volts) by more than a desired amount. In addition, because IN node 108 is capacitively coupled to pad 102, voltage overprotect circuit 204 prevents the voltage at IN node 108 from going below ground far enough to reverse bias the drain diodes of the transistors in Latch 206. Voltage overprotect circuit 204 comprises an over-voltage diode M2 and an under-voltage diode M10 to perform the aforementioned functions.

Latch 206 comprises two inverters. The first inverter formed by M8 and M9, the second inverter formed by M17 and M20. Latch 206 helps hold the high or low state on IN node 108. It also adds some hysteresis to circuit 300 and resists false AC data changes due to input voltage noise. Latch 206 provides a small amount of current at IN 108 and will absorb current caused by ringing at pad 102. For example, if a ½ volt swing occurs on pad 102, this will result in a ¼ volt swing at IN 108. Latch 206 absorbs the charge caused by the ¼ volt swing at IN 108, increasing the stability of the circuit. An aspect of circuit 300 is that noise of up to 1.25 volts can be applied to pad 102 without switching the output (INBUF-OUT) of output buffer 110.

DC input buffer (DC IN BUFFER) 106 performs two functions. First, at power up, because pad 102 is not switching, DC input buffer sets IN node 108 to match the state of pad 102 (the voltage at IN node 108 is 0 volts for the low state and approximately 1.2 volts for the high state). Second, DC input buffer 106 protects against overshoot and undershoot at pad 102. For example, once the IN node 108 switches states, there may be noise at the pad (e.g. in the high state the voltage at pad 102 may vary from 4-6 volts until it settles to 5 volts). Because the AC input buffer 104 passes voltage changes from pad 102 to IN node 108, DC input buffer prevents IN node 108 from changing (or holds IN node 108 to its present state).

For example, when switching from low to high, when DC input buffer 106 first switches, INB inverter 214 turns 32 on, causing both M32 and M33 turn on. This holds Intermediate Node 108 to approximately 0.5 Volt and bleeds off any excess charge at Intermediate Node 108 to ground. This prevents noise from changing the buffer immediately after switching. The effect of this circuit is to create a temporary, one shot hysteresis effect immediately after switching. Once the signal passes through the delay buffers, M32 and M33 are switched off by delay buffer 216, once again enabling AC input buffer 104 to switch IN node 108. In the illustrated embodiment, noise of up to 1.25 volts can appear on PAD 102 without causing a change in input buffer 106.

As illustrated, delay buffer 216 comprises 5 buffers, however, the number of buffers can be varied to set the amount of time desired before delay buffer 216 switches M32 and M33 off. For example, if a shorter time period is desired the number of buffers comprising delay buffer 216 is decreased, and if a longer time period is desired, the number of buffers comprising delay buffer 216 is increased.

DC in buffer 106 receives the input signal from the voltage tolerant input circuit 202 at an inverter formed by M31 and M27. The input signal is then passed to M34. M15 is configured as a diode and coupled in series to M34. As an example of operation of DC input buffer 106, when pad 102 is moving from a low state to a high state, the input is passed through voltage tolerant circuit 202 to M27 and M 31, which passes a low going signal to the gate of M34. M15 does not turn on until IN node 108 reaches a predetermined voltage (e.g. 0.5 volts), by this time M34 is switched off.

Conversely, if pad 102 is at ground and IN node 108 is at a high state, M34 and M15 turn on, pulling IN node 108 down, this switches latch 206. This will result in the IN node 108 matching the input signal (ground in this example) at pad 102.

If pad 102 is high (M30 will be on) and IN node 108 is low, M28 turns on. When M28 and M30 are on, they pull IN node 108 high. Delay buffer 216 eventually turns off M28, enabling IN node 108 subsequently to switch low without interference from DC input buffer 106.

Figure 4:
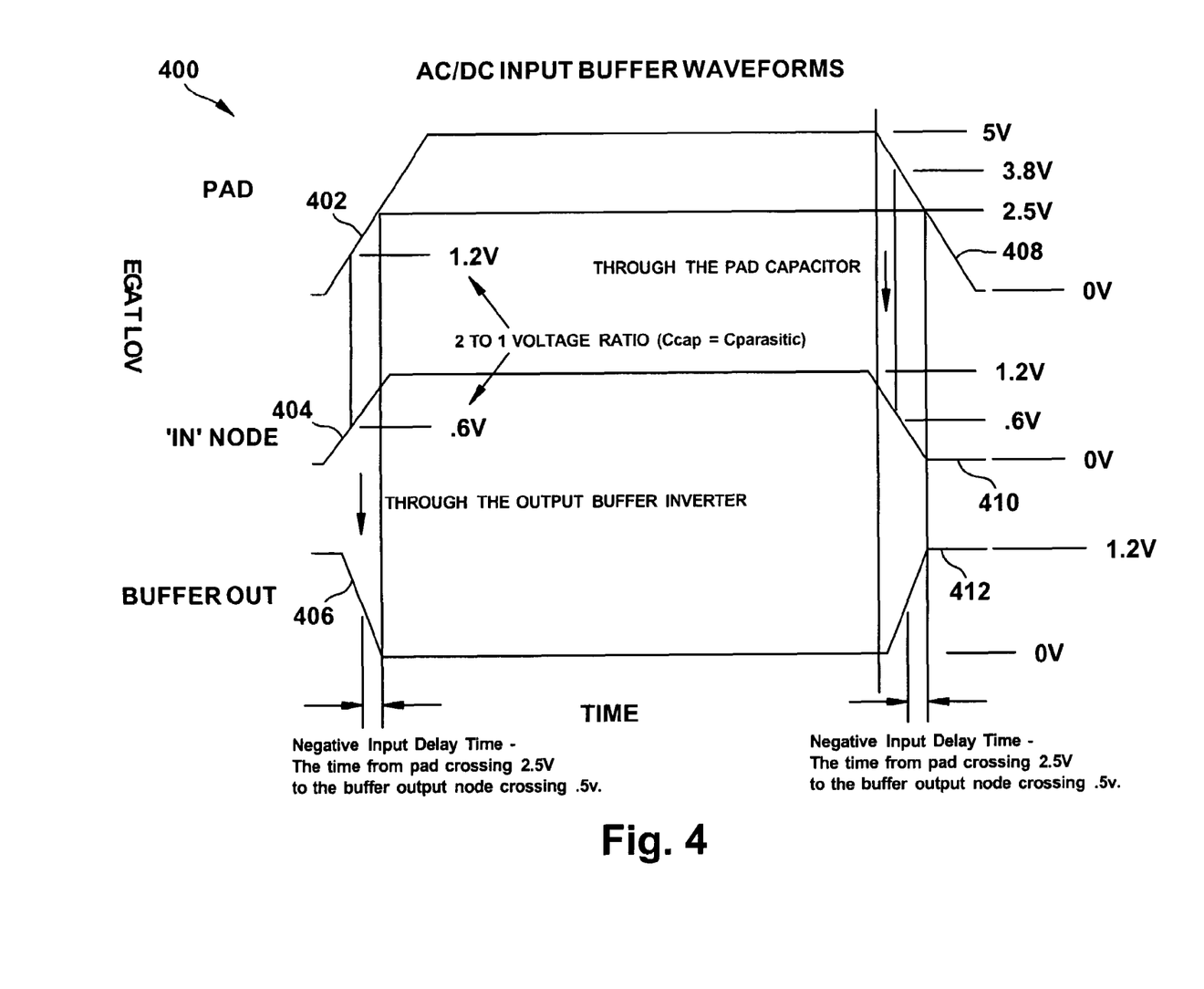
FIG. 4 is a timing diagram for an AC-DC input buffer configured in accordance with a preferred embodiment.

An aspect of circuit 300 is that switching can occur before Vin/2. For example for a 3.3V system, switching occurs at 1.25 V as opposed to 1.5 V. Therefore, the system appears to have a negative switch time, because the system has switched before it normally would switch (i.e. at Vin/2). For slower edge rates, the system appears to switch even faster. Referring to FIG. 4, there is illustrated a timing diagram 400. Signal 402 shows pad 102 switching from 0V to 5V. Signal 404 is the corresponding change at IN node 108 and signal 406 shows the output (BUFFER OUT) from out buffer 110 (INBUF-OUT). As can be seen from FIG. 4, when signal 402 at pad 102 reaches 1.2 volts, signal 404 at IN node 108 reaches 0.6 volts, by which time signal 406 at out buffer 101 has already switched approximately halfway from high (1.6 volts) to low (ground or 0v). By the time signal 402 has reached 2.5 volts (halfway between 0 and 5 volts), signal 406 has already switched to 0 volts (ground).

Signals 408, 410, 412 illustrate the voltage changes at pad 102, IN node 108 and the output of out buffer 110 respectively when pad 102 switches from high (5 volts) to low (ground or 0v). By the time pad 102 has changed by 1.2 volts, to 3.8 volts, as illustrated by signal 408, signal 410 at IN node 108 has changed by 0.6v causing the output buffer to switch to 0.6 volts (halfway between the low and high output states) as shown by signal 412. By the time signal 408 reaches 2.5 volts, signal 410 at IN node 410 has already reached 0 volts and signal 412 has already switched to 1.2v.

Figure 5:
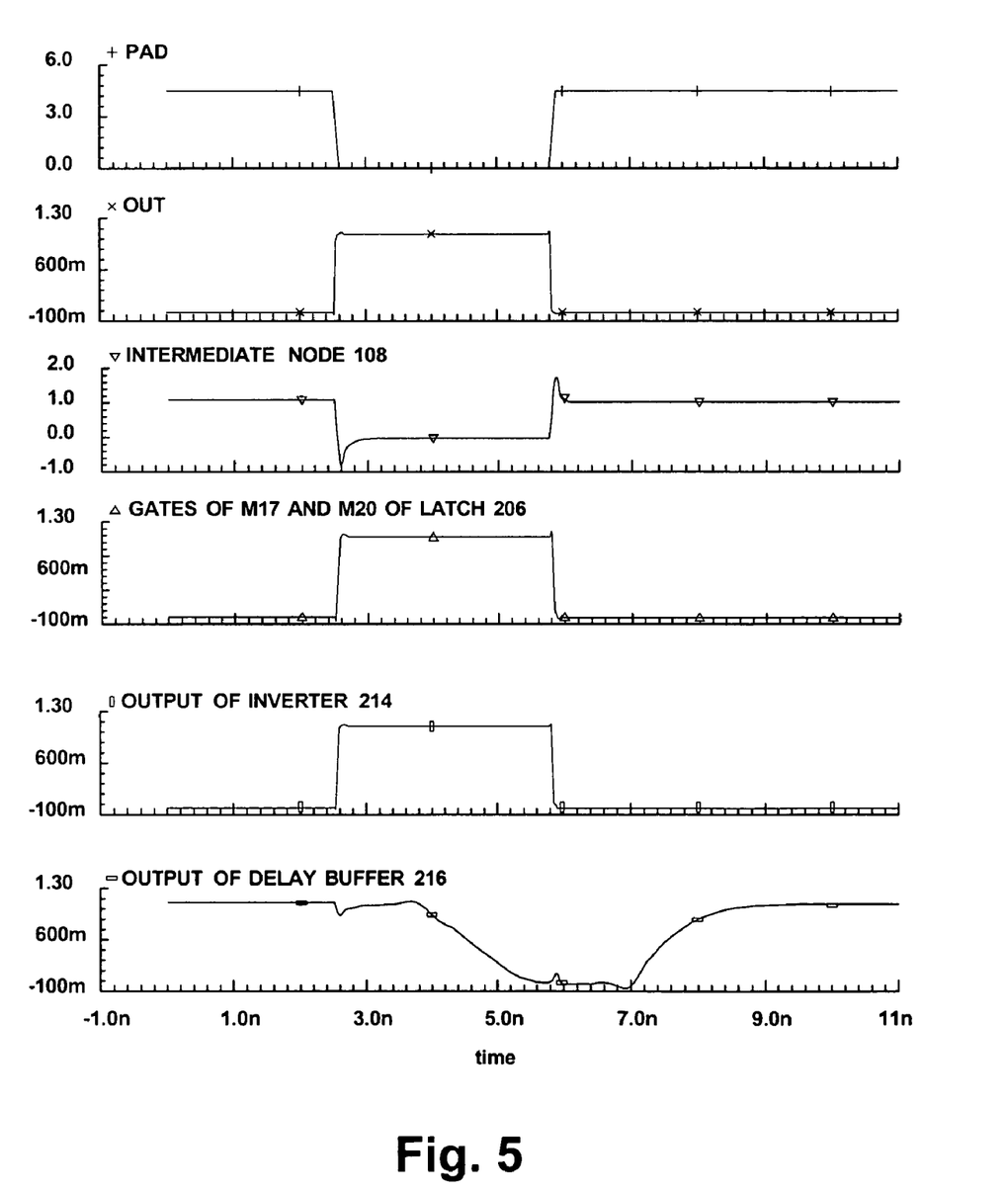
FIG. 5 is a detailed transient response timing diagram for an AC-DC input buffer configured in accordance with a preferred embodiment.

FIG. 5 illustrates an exemplary transient response for circuit 300. Initially pad 102 is high (5 volts), then switches to low (0v) and returns to high (5 volts). FIG. 5 shows the signal at PAD 102 and the corresponding signals at the output of buffer 110 (OUT), intermediate node 108, the gates M17 and M20 of latch 206, the output of inverter 214 and the output of delay buffer 216.

Figure 6:
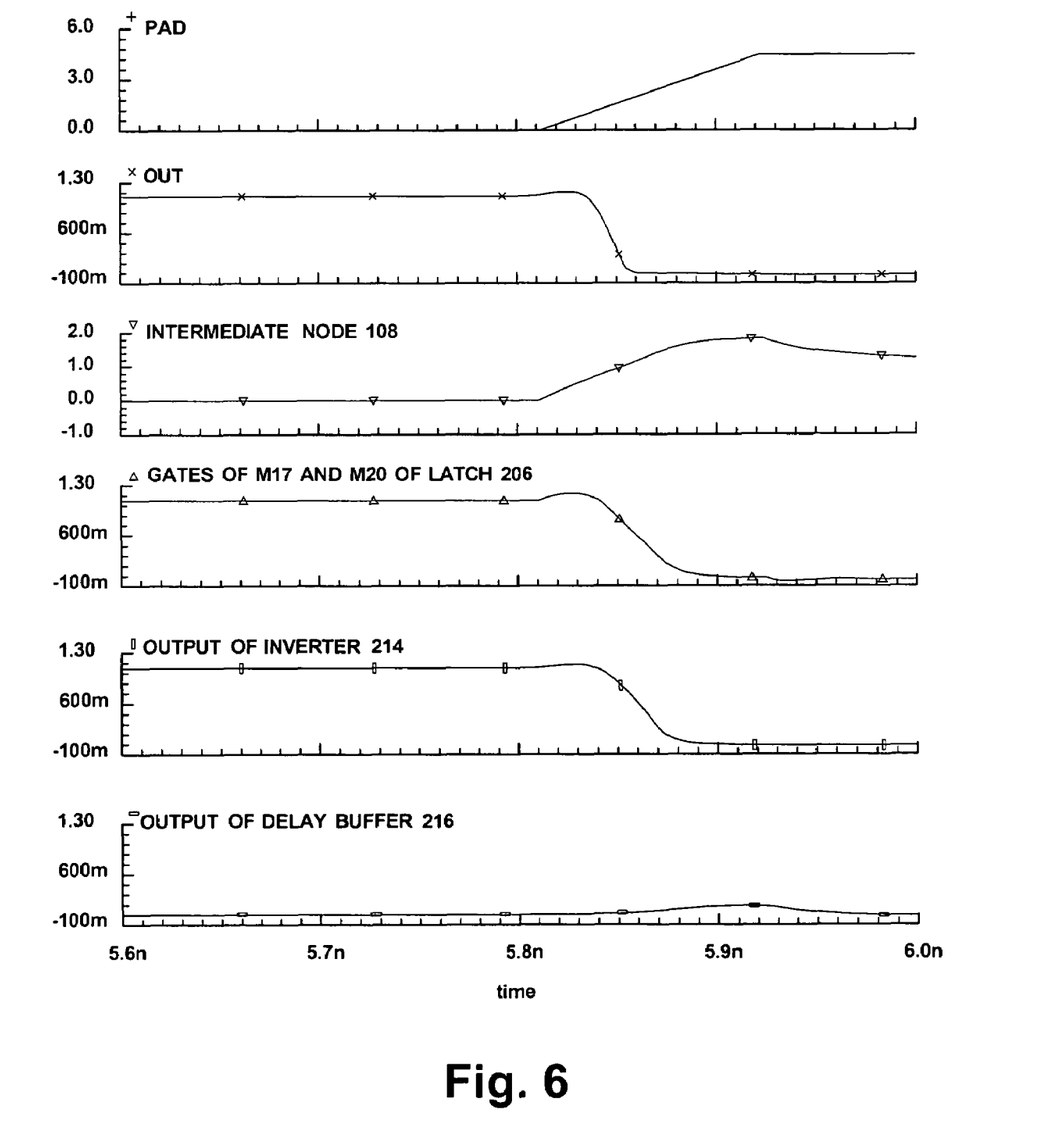
FIG. 6 is a detailed transient response timing diagram when the pad voltage increases from a low state to a high state for an AC-DC input buffer configured in accordance with a preferred embodiment.

FIG. 6 is a more detailed timing diagram showing an exemplary transient response for circuit 300 when the signal at pad 102 switches from low (0v) to high (5 v). FIG. 6 shows the signal at PAD 102 and the corresponding signals at the output of buffer 110 (OUT), intermediate node 108, the gates M17 and M20 of latch 206, the output of inverter 214 and the output of delay buffer 216.

Figure 7:
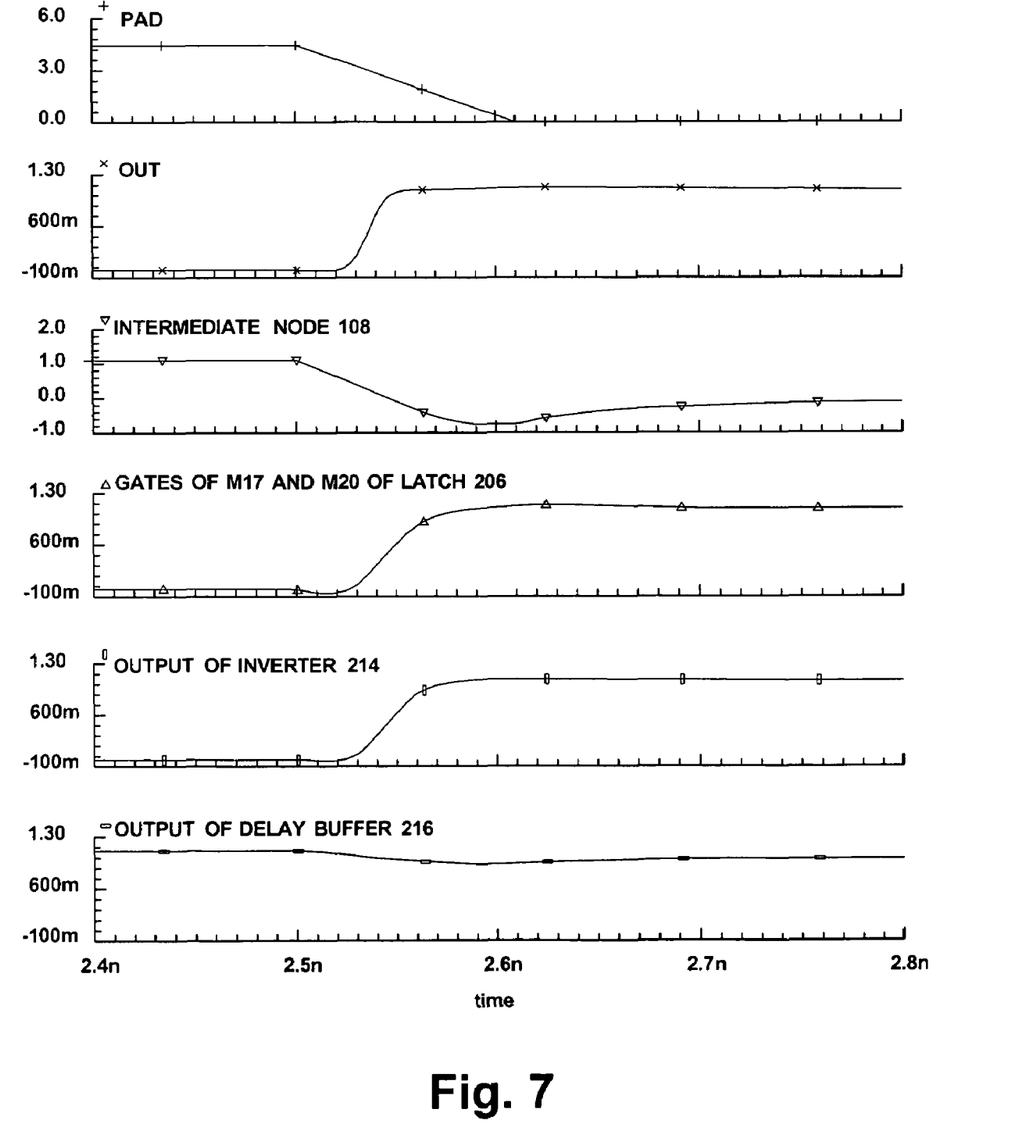
FIG. 7 is a detailed transient response timing diagram when the pad voltage increases from a high state to a low state for an AC-DC input buffer configured in accordance with a preferred embodiment.

FIG. 7 is a more detailed timing diagram showing an exemplary transient response for circuit 300 when the signal at pad 102 switches from high (5v) to low (0 v). FIG. 7 shows the signal at PAD 102 and the corresponding signals at the output of buffer 110 (OUT), intermediate node 108, the gates M17 and M20 of latch 206, the output of inverter 214 and the output of delay buffer 216.

Figure 8:
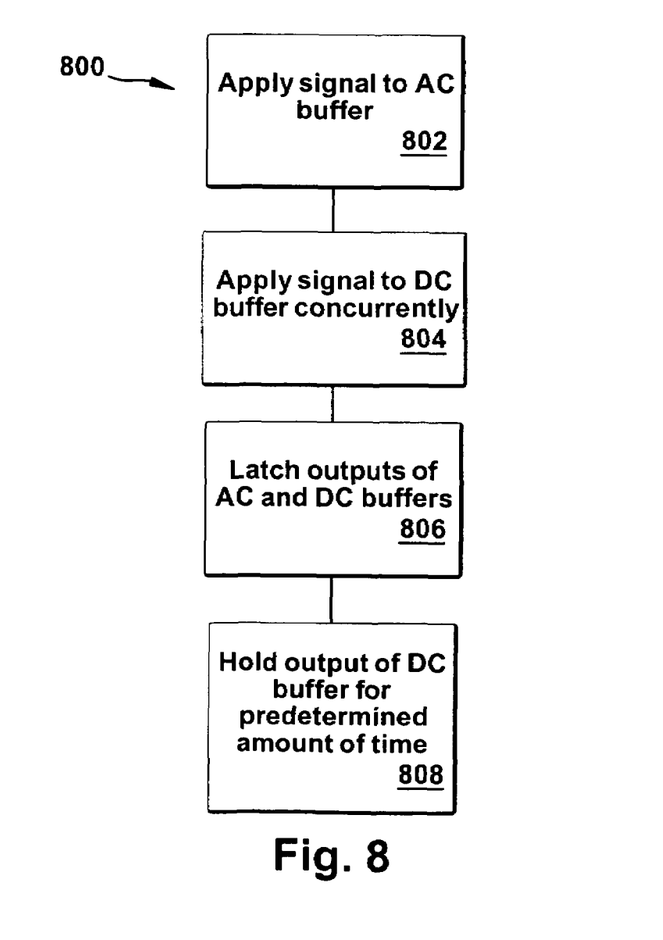
FIG. 8 is a block diagram of a methodology for processing a signal concurrently through an AC input buffer and a DC input buffer to an inverter circuit.

In view of the foregoing structural and functional features described above, a methodology 800 in accordance with various aspects of the present invention will be better appreciated with reference to FIG. 8. While, for purposes of simplicity of explanation, methodology 800 of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

At 802, a signal is applied to an AC Buffer. The AC buffer is coupled to an output buffer. Changes to signals that are applied to an AC buffer are quickly passed through the AC buffer. At 804, the signal is concurrently applied to a DC buffer. The DC buffer is coupled in parallel to the AC buffer. The DC buffer provides stability and is resistant to changes due to noise at the inputs of the AC and DC buffers. At 806, the outputs of the AC and DC buffer are latched. At 808, the output of the DC buffer is held for a predetermined amount of time. The predetermined amount of time is preferably a time period that noise, such as ringing can be expected at the input of the DC buffer. Because the outputs of the AC and DC buffers are coupled together, ringing at the input nodes of the buffers, which would be passed through by the input buffer is ameliorated by the DC buffer.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

The invention claimed is:

1. A circuit, comprising:
a capacitance element having an input and an output;
a direct current input buffer having an input and an output, wherein the input of the direct current input buffer is coupled to the input of the capacitance element and the output of the direct current input buffer is coupled to the output of the capacitance element;
a feedback circuit coupled to the direct current input buffer, the feedback circuit is operable to change the output of the direct current output buffer to match the input of the direct current input buffer responsive to determining the output of the direct current input buffer does not match the input of the direct current input buffer;
a delay circuit coupled to the feedback circuit, the delay circuit is configured to turn off the feedback circuit a predetermined amount of time after the output of the direct current input buffer is changed to match the input of the direct current input buffer; and
an output buffer coupled to the output of the direct current input buffer and the output of the capacitance element.

2. The circuit according to claim 1, wherein the capacitance element comprises a metal capacitor having interdigitated metal lines.

3. The circuit according to claim 1, further comprising a voltage tolerant input circuit coupled in series with the input of the direct current input buffer, wherein the voltage tolerant input circuit limits the amount of voltage applied to the input of the direct current input buffer.

4. The circuit according to claim 3, wherein the voltage tolerant input circuit comprises at least one diode coupled between an input of the voltage tolerant input circuit and a supply voltage, and the at least one diode is configured to conduct if the voltage at the input of the voltage tolerant input circuit exceeds the power supply voltage by a predetermined amount.

5. The circuit according to claim 1, further comprising a voltage overprotect circuit coupled to the output of the direct current input buffer and the output of the capacitance element, the voltage overprotect circuit configured to prevent the voltage at the output of the direct current input buffer and the output of the capacitance element from exceeding an upper predetermined voltage.

6. The circuit according to claim 5, wherein the voltage overprotect circuit is further configured to prevent the voltage at the output of the direct current input buffer and the output of the capacitance element from going below a lower predetermined voltage.

7. The circuit according to claim 1, further comprising a latch coupled to the output of the direct current input buffer and the output of the capacitance element.

8. The circuit according to claim 1, wherein the output buffer is an inverting buffer.

9. A circuit, comprising:
inverting means;
means for capacitively coupling an input signal to the inverter means;
means for direct current buffering the input signal to the inverter means in parallel with the means for capacitively coupling, the means for direct current buffering having an input and an output;
means for providing feedback to the means for direct current buffering, the means for providing feedback is operable to provide feedback to the means for direct current buffering responsive to the output of the means for providing feedback not matching the input of the means for direct current buffering; and
delay means for turning off the means for providing feedback a predetermined amount of time after the output of the means for direct current buffering has been changed to match the input of the means for direct current buffering.

10. The circuit according to claim 9, further comprising means for reducing the level of the input signal to the means for direct current buffering.

11. The circuit according to claim 10, wherein the means for reducing the level of the input signal is coupled in series with the means for direct current buffering.

12. The circuit according to claim 9, further comprising means for protecting against an overvoltage coupled between the means for capacitively coupling and the inverter means.

13. The circuit according to claim 9, further comprising means for protecting against an undervoltage coupled between the means for capacitively coupling and the inverter means.

14. The circuit according to claim 9, further comprising means for latching coupled between the means for capacitively coupling and the inverter means.

15. A method, comprising:
applying a signal to an input of a buffer through a capacitance element; and
applying the signal to the input of the buffer through a direct current (DC) buffer coupled in parallel with the capacitance element concurrently to applying the signal to the capacitance element;
applying a feedback signal to the DC buffer responsive to determining an output of the DC buffer does not match the signal at the input of the DC buffer; and
turning off the feedback signal a predetermined amount of time after applying the feedback signal.

16. A method according to claim 15, further comprising latching the input of the buffer.

17. A method according to claim 15, further comprising reducing the signal level before applying the signal to the DC buffer.

* * * * *